United States Patent
Ng et al.

(10) Patent No.: US 10,773,509 B2
(45) Date of Patent: Sep. 15, 2020

(54) PAD STRUCTURE AND FABRICATION METHODS

(71) Applicant: Applied Materials, Inc., Santa Clara, CA (US)

(72) Inventors: Hou T. Ng, San Jose, CA (US); Nag B. Patibandla, Pleasanton, CA (US); Rajeev Bajaj, Fremont, CA (US); Daniel Redfield, Morgan Hill, CA (US); Ashwin Chockalingam, San Jose, CA (US); Mayu Yamamura, San Carlos, CA (US); Mario Cornejo, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 586 days.

(21) Appl. No.: 15/452,053

(22) Filed: Mar. 7, 2017

(65) Prior Publication Data
US 2017/0259499 A1 Sep. 14, 2017

Related U.S. Application Data

(60) Provisional application No. 62/305,582, filed on Mar. 9, 2016.

(51) Int. Cl.
*B33Y 10/00* (2015.01)
*G03F 7/00* (2006.01)
(Continued)

(52) U.S. Cl.
CPC ............. *B33Y 10/00* (2014.12); *B24B 37/22* (2013.01); *B33Y 30/00* (2014.12); *B33Y 80/00* (2014.12);
(Continued)

(58) Field of Classification Search
CPC ............................. G03F 7/0014; G03F 7/0035
See application file for complete search history.

(56) References Cited

U.S. PATENT DOCUMENTS 3,808,751 A * 5/1974 Usui ..................... B24C 1/04
451/31
5,984,769 A 11/1999 Bennett et al.
(Continued)

FOREIGN PATENT DOCUMENTS

| KR | 10-0804275 B1 | 2/2008 |
|---|---|---|
| WO | 2009158665 A1 | 12/2009 |

OTHER PUBLICATIONS

International Search Report and Written Opinion in related application PCT/US2017/021119 dated Jun. 27, 2017.

*Primary Examiner* — Leith S Shafi
*Assistant Examiner* — Nicholas R Krasnow
(74) *Attorney, Agent, or Firm* — Patterson + Sheridan LLP (57) ABSTRACT

A method and apparatus for manufacturing polishing articles used in polishing processes are provided. In one implementation, a method of forming a polishing pad is provided. The method comprises depositing an uncured first layer of a pad forming photopolymer on a substrate. The method further comprises positioning a first optical mask over the first layer of the uncured pad forming photopolymer. The first optical mask includes a patterned sheet of material having at least one aperture. The method further comprises exposing the uncured first layer of the pad forming photopolymer to electromagnetic radiation to selectively polymerize exposed portions of the uncured first layer of the pad forming photopolymer to form pad-supporting structures within the first layer of pad forming photopolymer.

20 Claims, 6 Drawing Sheets

(51) Int. Cl.
*G03F 7/20* (2006.01)
*B33Y 30/00* (2015.01)
*B33Y 80/00* (2015.01)
*B24B 37/22* (2012.01)
*B29K 105/00* (2006.01)

(52) U.S. Cl.
CPC .......... *G03F 7/0035* (2013.01); *G03F 7/2014* (2013.01); *B29K 2105/0058* (2013.01)

(56) References Cited

U.S. PATENT DOCUMENTS

| | | |
|---|---|---|
| 6,241,596 B1 | 6/2001 | Osterheld et al. |
| 6,273,806 B1 | 8/2001 | Bennett et al. |
| 6,520,847 B2 | 2/2003 | Osterheld et al. |
| 6,645,061 B1 | 11/2003 | Bennett et al. |
| 6,699,115 B2 | 3/2004 | Osterheld et al. |
| 7,192,336 B2 | 3/2007 | Kramer et al. |
| 7,382,959 B1 | 6/2008 | Jacobsen |
| 7,530,880 B2 | 5/2009 | Bajaj et al. |
| 7,815,778 B2 | 10/2010 | Bajaj |
| 7,846,008 B2 | 12/2010 | Bajaj |
| 8,066,555 B2 | 11/2011 | Bajaj |
| 8,075,745 B2 | 12/2011 | Bajaj |
| 8,177,603 B2 | 5/2012 | Bajaj |
| 8,292,692 B2 | 10/2012 | Bajaj |
| 9,162,340 B2 | 10/2015 | Joseph et al. |
| 2001/0046834 A1 | 11/2001 | Ramana et al. |
| 2002/0069591 A1 | 6/2002 | Yancey |
| 2002/0081951 A1* | 6/2002 | Boyd ................. B24B 53/12 451/56 |
| 2004/0055223 A1 | 3/2004 | Ono et al. |
| 2006/0160478 A1 | 7/2006 | Donohue et al. |
| 2012/0315830 A1 | 12/2012 | Joseph et al. |
| 2013/0074419 A1* | 3/2013 | Lakrout ............. B24B 37/26 51/297 |
| 2013/0231032 A1 | 9/2013 | Swedek et al. |
| 2015/0056892 A1 | 2/2015 | Vacassy et al. |
| 2016/0101500 A1 | 4/2016 | Fung et al. |
| 2016/0107295 A1 | 4/2016 | Bajaj et al. |
| 2016/0229023 A1 | 8/2016 | Lugg et al. |
| 2017/0080607 A1* | 3/2017 | Sahara ............. B29C 35/0805 |

* cited by examiner

PAD STRUCTURE AND FABRICATION METHODS

CROSS-REFERENCE TO RELATED APPLICATIONS

This application claims benefit of U.S. provisional patent application Ser. No. 62/305,582, filed Mar. 9, 2016. The aforementioned related patent application is herein incorporated by reference in its entirety.

BACKGROUND

Field

Implementations disclosed herein generally relate to polishing articles, and methods and systems for manufacturing polishing articles used in polishing processes.

Description of the Related Art

Chemical mechanical polishing (CMP) is a conventional process used in many different industries to planarize surfaces of substrates. In the semiconductor industry, uniformity of polishing and planarization has become increasingly significant as device feature sizes continue to decrease. During a CMP process, a substrate, such as a silicon wafer, is mounted on a carrier head with the device surface placed against a rotating polishing pad. The carrier head provides a controllable load on the substrate to push the device surface against the polishing pad. A polishing liquid, such as slurry with abrasive particles, is typically supplied to the surface of the moving polishing pad and polishing head. The polishing pad and polishing head apply mechanical energy to the substrate, while the pad also helps to control the transport of slurry, which interacts with the substrate during the polishing process.

A conventional polishing pad is typically made by molding, casting or sintering polymeric materials that include polyurethane materials. In the case of molding, polishing pads can be made one at a time, for example, by injection molding. In the case of casting, the liquid precursor is cast and cured into a cake, which is subsequently sliced into individual pad pieces. These pad pieces can then be machined to a final thickness. Pad surface features, including grooves which aid in slurry transport, can be machined into the polishing surface, or can be formed as part of the injection molding process. These methods of manufacturing polishing pads are expensive and time consuming, and often yield non-uniform polishing results due to the difficulties in the production and control of the feature dimensions of the pad surface. Non-uniformity has become increasingly significant as the dimensions of IC devices and feature sizes continue to shrink.

Accordingly, there remains a need for polishing pads, methods of manufacturing polishing pads, and systems for manufacturing polishing pads that provide uniform removal rates, have extended pad life, and minimize scratching of the polished substrate.

SUMMARY

Implementations disclosed herein generally relate to polishing articles, and methods and systems for manufacturing polishing articles used in polishing processes. In one implementation, a method of forming a polishing pad is provided. The method comprises depositing an uncured first layer of a pad forming photopolymer on a substrate. The method further comprises positioning a first optical mask over the first layer of the uncured pad forming photopolymer. The first optical mask includes a patterned sheet of material having at least one aperture. The method further comprises exposing the uncured first layer of the pad forming photopolymer to electromagnetic radiation to selectively polymerize exposed portions of the uncured first layer of the pad forming photopolymer to form pad-supporting structures within the first layer of pad forming photopolymer.

In another implementation, a method of forming a polishing pad is provided. The method comprises depositing an uncured first layer of pad forming photopolymer on a substrate. The method further comprises positioning a first optical mask over the uncured first layer of pad forming photopolymer. The optical mask includes at least one aperture. The method further comprises exposing the uncured first layer of pad forming photopolymer to multiple collimated beams at different incident angles through the first optical mask to at least partially cure a portion of the first layer of pad forming photopolymer to form at least a portion of a sub-pad of the polishing pad.

In yet another implementation, a processing system for forming a polishing pad is provided. The system comprises a first processing chamber for deposition of a pad forming photopolymer on a continuous sheet of material. The first processing chamber comprises a dispenser for dispensing the pad forming material and a doctor blade for removing excess material from the pad forming photopolymer. The system further comprises a second processing chamber for curing the pad forming photopolymer. The second processing chamber defines a second processing region with a curing device disposed therein. The system further comprises a third processing chamber for forming top pad features on the cured pad forming material via an additive manufacturing process.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations disclosed herein generally relate to polishing articles, and methods and systems for manufacturing polishing articles used in polishing processes. Certain details are set forth in the following description and in FIGS. 1-6 to provide a thorough understanding of various implementations of the disclosure. Other details describing well-known structures and systems often associated with polishing pads and systems for forming polishing pads are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

It should be understood that although the polishing articles described herein are polishing pads, the implementations describe herein are also applicable to other polishing articles including, for example, buffing pads. Further, although the polishing articles described herein are discussed in relation to a chemical mechanical polishing process, the polishing articles and methods of manufacturing polishing articles described herein are also applicable to other polishing processes including polishing lenses and other processes including both abrasive and non-abrasive slurry systems. In addition, the polishing articles described herein may be used in at least the following industries: aerospace, ceramics, hard disk drive (HDD), MEMS and Nano-Tech, metalworking, optics and electro-optics, and semiconductor, among others.

Figure 1:
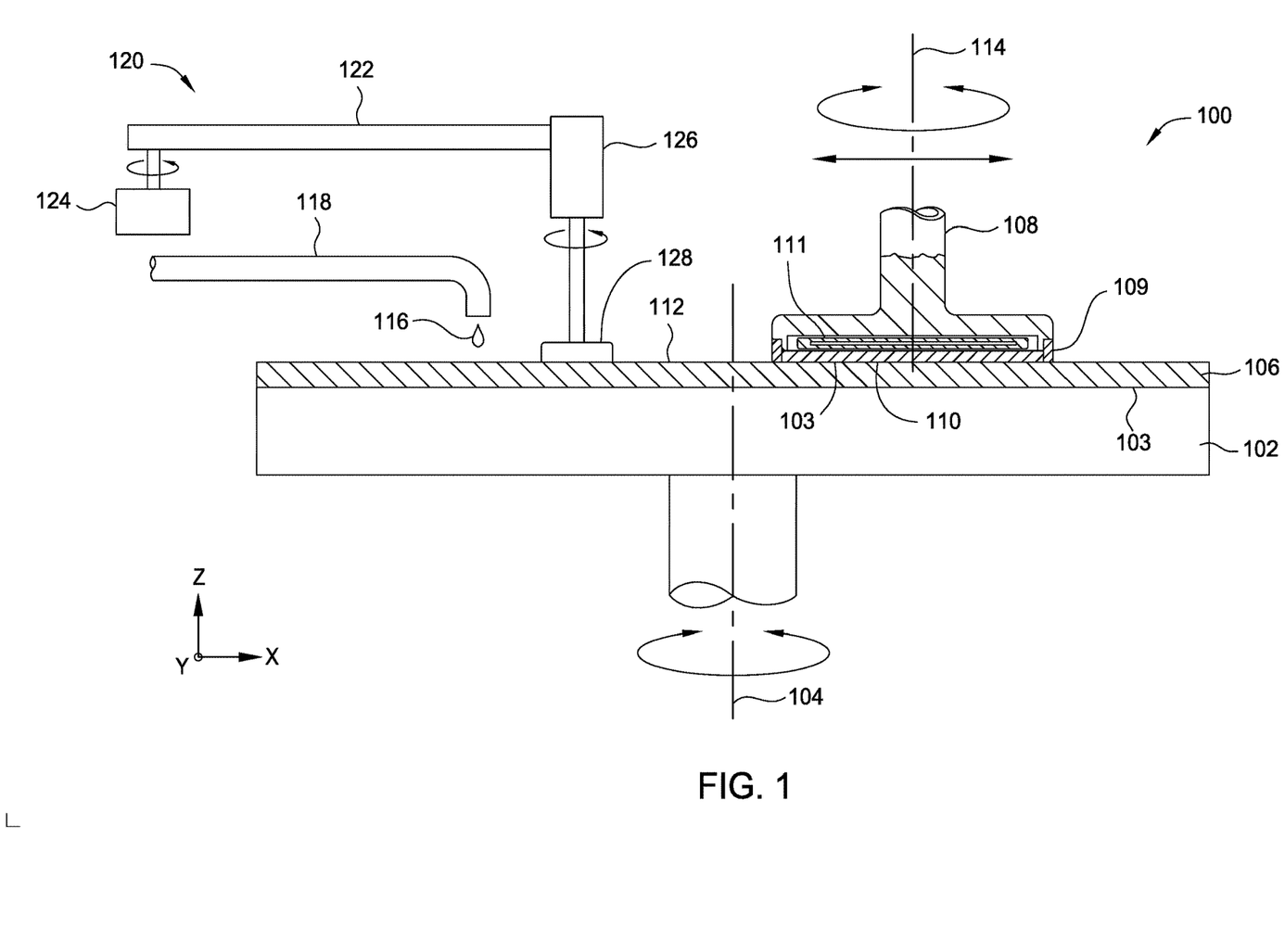
FIG. 1 is a schematic sectional view of a polishing station having a polishing pad formed according to implementations described herein.

FIG. 1 is a schematic sectional view of a polishing station 100 having a polishing pad 106 formed according to implementations described herein. The polishing station 100 may be positioned within a larger chemical mechanical polishing (CMP) system that contains multiple polishing station(s) 100. The polishing station 100 includes a platen 102. The platen 102 may rotate about a central axis 104. The polishing pad 106 may be placed on the platen 102. While not intending to limit the disclosure provided herein, typically, the polishing pad 106 covers an upper surface 103 of the platen 102 which is at least one to two times larger than the size of the substrate 110 (e.g., substrate diameter) that is to be processed in the polishing station 100. In one example, the polishing pad 106 and platen 102 are between about 6 inches (150 millimeters) and about 40 inches (1,016 millimeters) in diameter. The polishing pad 106 includes a polishing surface 112 configured to contact and process one or more substrate(s) 110. The platen 102 supports the polishing pad 106 and rotates the polishing pad 106 during polishing. A carrier head 108 may hold a substrate 110 being processed against the polishing surface 112 of the polishing pad 106. A polishing interface is formed between the polishing surface 112 and the substrate 110. The carrier head 108 typically includes a flexible diaphragm 111 that is used to urge the substrate 110 against the polishing pad 106 and a carrier ring 109 that is used to correct for an inherently non-uniform pressure distribution found across the substrate's surface during the polishing process. The carrier head 108 may rotate about a central axis 114 and/or move in a sweeping motion to generate relative motions between the substrate 110 and the polishing pad 106.

During polishing, a polishing fluid 116, such as an abrasive slurry or non-abrasive slurry, may be supplied to the polishing surface 112 by a delivery arm 118. The polishing fluid 116 may contain abrasive particles, a pH adjuster and/or chemically active components to enable chemical mechanical polishing of the substrate. The slurry chemistry of polishing fluid 116 is designed to polish substrate surfaces and/or features that may include metals, metal oxides, and semimetal oxides. One will note that the surface topography of the polishing pad 106 is used to control the transport of the polishing fluid 116 (e.g., slurry) which interacts with the substrate 110 during the polishing process. For example, the surface topology of the polishing pad 106 may consist of grooves, channels and other protuberances, which are formed by casting, molding, or machining, which may be disposed over, upon and within the polishing pad 106.

In some implementations, the polishing station 100 includes a pad conditioning assembly 120 that includes a conditioning arm 122 and actuators 124 and 126. The actuators 124 and 126 are configured to cause a pad conditioning disk 128 (e.g., diamond impregnated disk) to be urged against and sweep across the polishing surface 112 at different times during the polishing process cycle to abrade and rejuvenate the polishing surface 112 of the polishing pad 106. During processing, moving the polishing pad 106 and carrier head 108 apply mechanical energy to the substrate 110, which in combination with the chemicals and abrasive components in the polishing fluid 116, will cause the surface of the substrate to become planarized.

In some implementations, the polishing pads are formed by a layer-by-layer automated sequential deposition of at least one resin precursor composition followed by at least one curing process, wherein each layer may represent at least one polymer composition (e.g., photopolymer and/or photomonomer), and/or regions of different compositions. The compositions may include functional polymers, functional oligomers, porosity-forming agent(s) (e.g., water), emulsifiers/surfactants, photoinitiators inorganic particles, reactive diluents, and additional additives. Examples of photopolymers and/or photomonomers that may be used to form the polishing pads described herein include but are not limited to photopolymer acrylate monomers and oligomers, such as polyurethane acrylate, polyester acrylate, and epoxy acrylate. The functional polymers may include multifunctional acrylate precursor components. To form a plurality of solid polymeric layers, one or more curing processes may be used, such as exposure of one or more compositions to UV radiation and/or thermal energy. In this fashion, an entire polishing pad may be formed from a plurality of polymeric layers by an additive manufacturing process. A thickness of the cured layer may be from about 0.1 micron to about 1 mm, such as 5 microns to about 100 microns, and such as 25 microns to about 30 microns.

Figure 2:
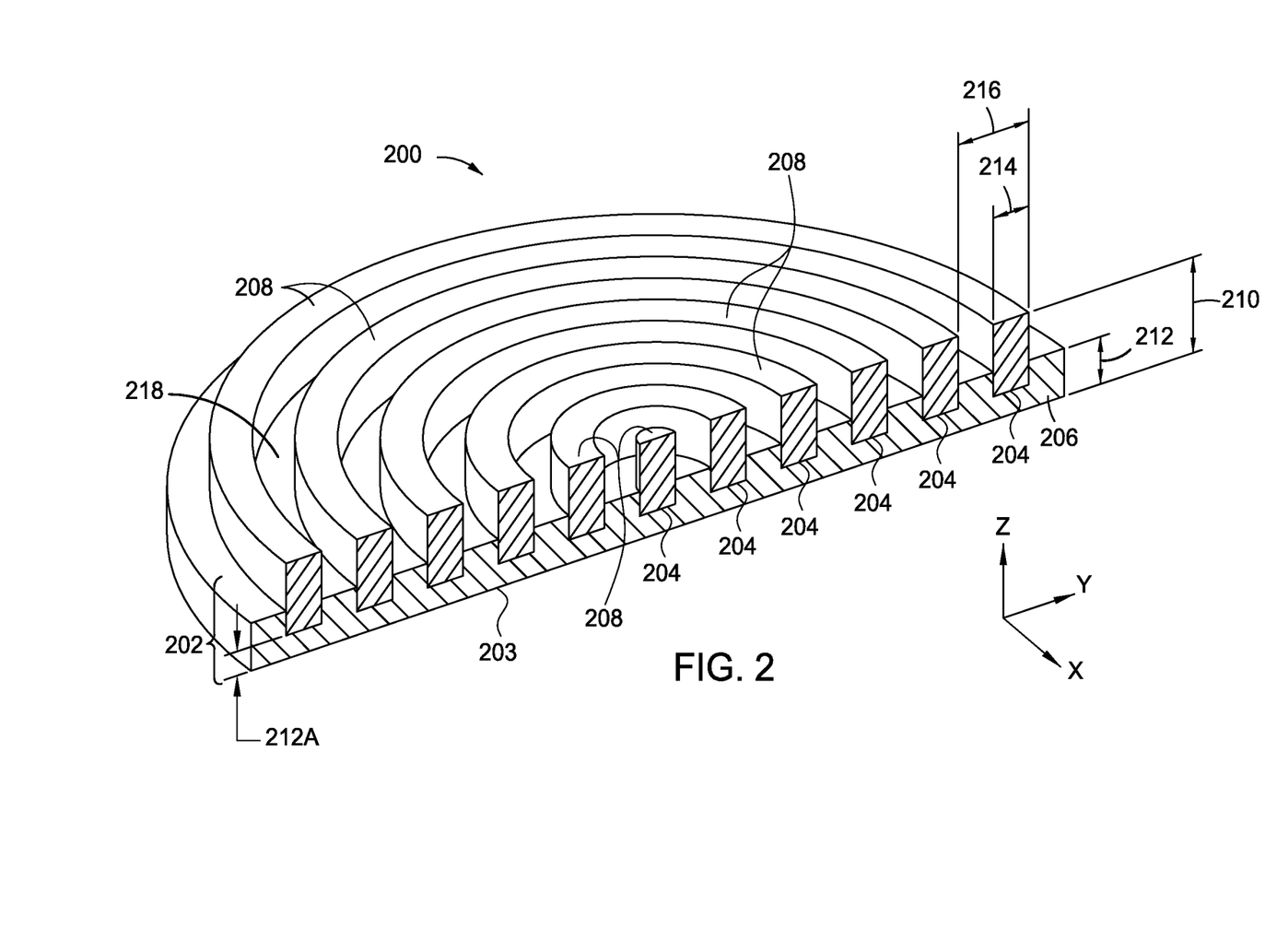
FIG. 2 is a schematic isometric and cross-sectional view of a polishing pad according to an implementation of the present disclosure.

FIG. 2 is a schematic isometric and cross-sectional view of a polishing pad 200 formed according to implementations of the present disclosure. The polishing pad 200 shown in FIG. 2 is exemplary and is not intended to be limiting as to the scope of the disclosure provided herein, since other configurations may be formed by use of the one or more of the additive manufacturing processes and systems described herein. One or more first polishing element(s) 204 may be formed in alternating concentric rings that are coupled to one or more second polishing elements 206 to form a circular pad body 202. At least one of the one or more first polishing element(s) 204 and the one or more second polishing elements 206 may be formed according to the implementations described herein. In one implementation, a height 210 of the first polishing element(s) 204 from a supporting surface 203 is higher than a height 212 of the second polishing element(s) 206 so that the upper surface(s) 208 of the first polishing element(s) 204 protrude above the second polishing element(s) 206. In one implementation, the first polishing element(s) 204 is disposed over a portion 212A of the second polishing element(s) 206. Grooves 218 or channels are formed between the first polishing element(s) 204, and at least include a portion of the second polishing element(s) 206. During polishing, the upper surface(s) 208 of the first polishing element(s) 204 form a polishing surface that contacts the substrate, while the grooves 218 retain and channel the polishing fluid. In one implementation, the first polishing element(s) 204 are thicker than the second polishing element(s) 206 in a direction normal to a plane parallel to the polishing surface, or upper surface(s) 208, of the pad body 202 (i.e., Z-direction in FIG. 2) so that the channels or grooves 218 are formed on the top surface of the pad body 202.

In one implementation, a width 214 of the first polishing element(s) 204 may be between about 100 microns and about 5 millimeters, for example, between about 250 microns and about 5 millimeters. The pitch 216 between the hard first polishing element(s) 204 may be between about 200 microns and about 5 millimeters, for example, between about 0.5 millimeters and about 5 millimeters. Each first polishing element 204 may have a width within a range between about 250 microns and about 2 millimeters. The width 214 and/or the pitch 216 may vary across a radius of the polishing pad 200 to define zones of varied hardness, porosity, or both hardness and porosity.

Figure 3:
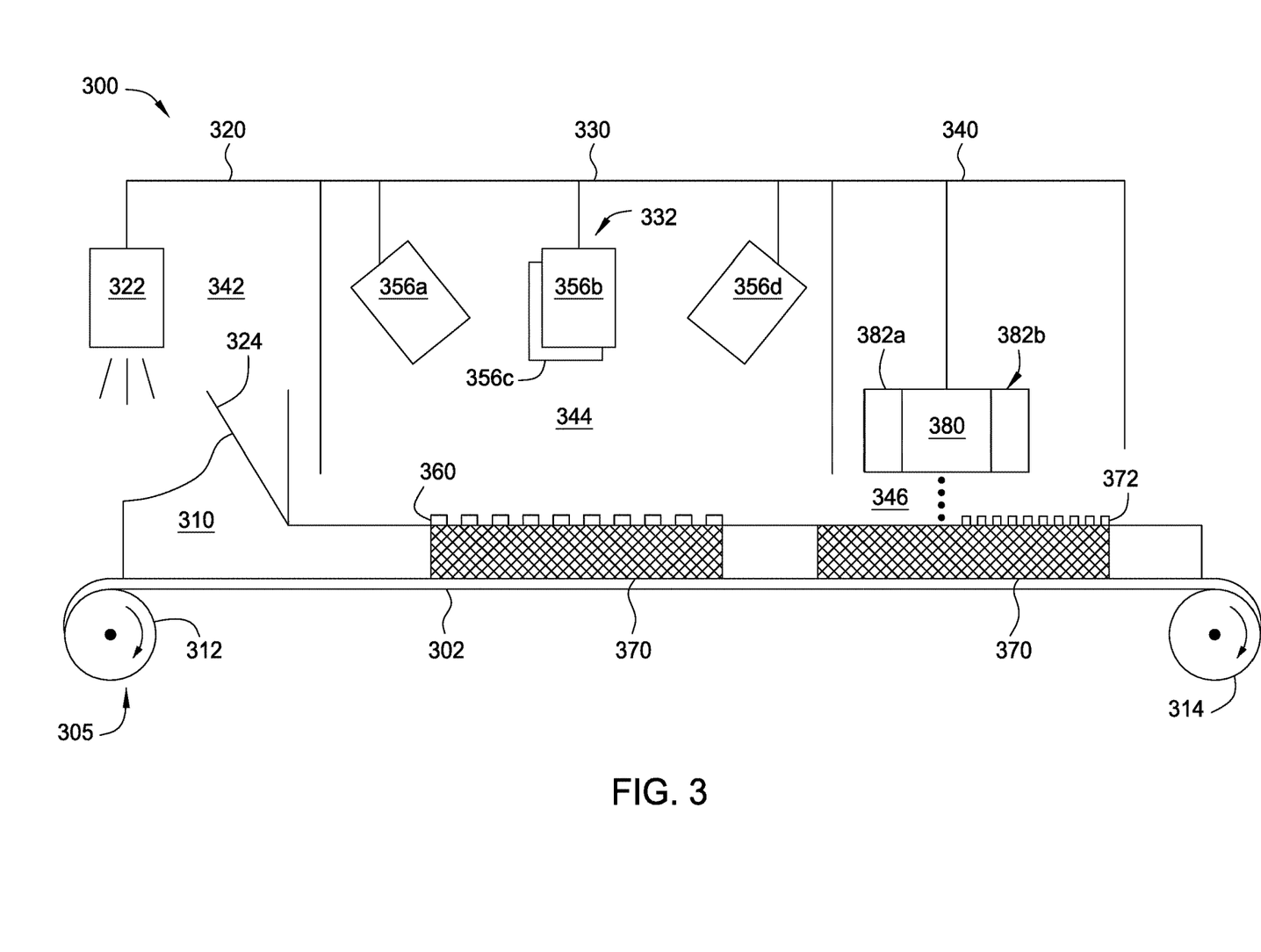
FIG. 3 illustrates a schematic view of a system for manufacturing polishing pads according to implementations described herein.

FIG. 3 illustrates a schematic view of a processing system 300 for manufacturing polishing pads according to implementations described herein. In certain implementations, the processing system 300 is a roll-to-roll processing system. In certain implementations, the processing system 300 comprises a plurality of processing modules or chambers 320, 330 and 340 arranged in a line, each configured to perform one processing operation to a pad forming material 310 (e.g., photopolymer, UV curable resin). In one implementation, the processing chambers 320, 330 and 340 are stand-alone modular processing chambers wherein each modular processing chamber is structurally separated from the other modular processing chambers. Therefore, each of the stand-alone modular processing chambers, can be arranged, rearranged, replaced, or maintained independently without affecting each other. The processing chambers 320, 330 and 340 are configured to process at least one side of the pad forming material 310. Although the processing system 300 is configured to process a horizontally oriented pad forming material 310, the processing system 300 may be configured to process pad forming material positioned in different orientations, for example, a vertically oriented pad forming material 310. In one implementation, the processing system 300 is configured to process pad forming material positioned on discrete substrates.

In certain implementations, the processing system 300 comprises a common transport architecture 305. In certain implementations, the common transport architecture 305 is a roll-to-roll system. The common transport architecture 305 may comprise any transfer mechanism capable of moving a continuous sheet of material 302 (e.g., a web) on which the pad forming material is formed through the processing region of the processing chambers 320, 330 and 340. The common transport architecture 305 may include a common transport architecture. The common transport architecture may comprise a reel-to-reel system with a common take-up-reel 314 and a feed reel 312 for the system. The take-up reel 314 and the feed reel 312 may be individually heated. At least one of the take-up reel 314 and the feed reel 312 may have a tension retaining mechanism for applying tension to the substrate to create a flat smooth surface. The common transport architecture 305 may further comprise one or more intermediate transfer reels (not shown) positioned between the take-up reel 314 and the feed reel 312. The common transport architecture 305 may comprise a track system, which extends through the processing region or discrete processing regions and is configured to transport either a web substrate or discrete substrates positioned on the continuous sheet of material 302. The substrate may comprise any suitable material for processing (e.g., pressure-sensitive adhesives (PSA), plastics, thermoplastics, metallic foil, etc.).

In certain implementations, it may be advantageous to have separate or discrete processing regions, modules, or chambers for each process. For implementations having discrete processing regions, modules, or chambers, the common transport architecture may be a reel-to-reel system where each chamber or processing region has an individual take-up-reel and feed reel and one or more optional intermediate transfer reels positioned between the take-up reel and the feed reel. The common transport architecture may comprise a track-system. The track-system extends through the processing regions or discrete processing regions. The track system is configured to transport either a web substrate or discrete substrates. Although the processing system 300 is depicted as having separate processing regions, in some implementations, the processing system shares a common processing region wherein all of the processes are performed.

The processing system 300 may comprise the feed reel 312 and the take-up reel 314 for moving the pad forming material 310 through the different processing chambers, a first processing chamber 320 for deposition of a resinous pad forming material, a second processing chamber 330 for curing the resinous pad forming material, and a third processing chamber 340 for forming top pad features on the cured pad forming material. In some implementations, the finished polishing pad will not be collected on take-up reel 314 as shown in the figure, but may go directly for additional processing (e.g., dicing, cleaning, annealing, and/or packaging).

The first processing chamber 320 is configured for depositing a resinous film of pad forming material 310 on the continuous sheet of material 302. The resinous film of pad forming material 310 may have a thickness from about 0.1 to about 10 millimeters. Any suitable resinous material for forming a pad with chosen properties may be used. In some implementations, the starting material may be mixed with abrasive without having to worry about size distribution. The first processing chamber 320 defines a first processing region 342. Any suitable resin deposition process may be used to deposit the pad forming material 310 on the continuous sheet of material 302. In one implementation, the pad forming material 310 is a resinous material that is UV curable (e.g., a photopolymer). The pad forming material 310 may further include abrasive materials. Deposition of the pad forming material may be by a single-pass or multi-pass doctor blade coating process, a slot-die coating process, a thin film transfer system (including large area pattern printing systems such as gravure printing systems, off-set transfer printing systems, digital printing systems) or a spraying process. The first processing chamber 320 includes a dispenser 322 for dispensing the pad forming material 310 and a doctor blade 324 for removing excess material from the dispensed pad forming material 310.

After deposition, the pad forming material 310 may be solidified or partially solidified by use of a curing device 332 that is disposed within the second processing chamber 330 of the processing system 300. In one implementation, the second processing chamber 330 is configured for massively parallel UV optical exposure. The second processing chamber 330 defines a second processing region 344 with the curing device 332 disposed therein. In one implementation, the curing device 332 includes a plurality of electromagnetic sources 356a-356d. The curing process performed by the curing device 332 may be performed by heating the pad forming material 310 to a curing temperature or exposing the pad to one or more forms of electromagnetic radiation or electron beam curing. In one example, the curing process may be performed by exposing the pad forming material 310 to radiation generated by an electromagnetic radiation source, such as a visible light source, an ultraviolet light source, x-ray source, light-emitting diode (LED) source, broadband light source, or other type of electromagnetic wave source that is disposed within the curing device 332. In one example, the curing device 332 includes a UV wavelength LED source and is used to cure at least a portion of the pad forming material 310.

In one implementation, an optical mask 360 is positioned over the resinous film of pad forming material 310 prior to curing. The optical mask 360 may be disposed on the surface of the pad forming material 310, secured to the surface of the pad forming material 310, or positioned in close proximity to the surface of the pad forming material 310. In some configurations, the optical mask 360 is separated from the pad forming material by a UV transparent substrate. The optical mask 360 may include a patterned sheet of material. In one implementation, the optical mask 360 is a physical mask, such as a ceramic, polymeric, or metal plate, which has a plurality of holes or features formed therethrough. In one implementation, the optical mask includes a patterned sheet of material having at least one aperture. In one example, the holes may have a diameter from about 1 micrometer to about 10 millimeters (e.g., from about 5 micrometers to about 10 millimeters) in size formed therethrough.

By use of the optical mask 360, truss or pad supporting structure(s) can be formed within portions of the pad forming material 310 by selective polymerization of chosen portions of the dispensed pad forming material 310. Selective polymerization is created by the exposure (or non-exposure) of chosen portions of the pad forming material 310 to the radiation generated by one or more of the electromagnetic radiation sources. The properties of the formed structures can be tailored by use of the optical mask(s) or reticles, which may have features that have a chosen spatial pattern and resolution. The properties of the formed structures can also be adjusted by the use of different exposure sequences. The formed structures can thus provide regions of differing physical properties (e.g., density, modulus, etc.) within regions of the polishing pad. The mechanical properties of the pad structure can be adjusted via varying the degree of exposure to the electromagnetic energy. Exposure duration of the electromagnetic radiation can range from one second to minutes. In one implementation, either the sub-pad only or both the sub-pad and the top pad portions of a polishing pad are formed using this deposition and curing process. In another implementation, either portions of the sub-pad only or portions of both the sub-pad and the top pad are formed using this deposition and curing process.

In one implementation, the second processing chamber 330 is configured to form self-propagating photopolymer waveguides using the curing device 332 and the optical mask 360. In some configurations, the layer of pad forming material 310 (e.g., photomonomer and/or photopolymer) is exposed to energy (e.g., multiple collimated beams) from the electromagnetic sources 356a-356d. The electromagnetic sources 356a-356d may be positioned to deliver collimated beams at different incident directions/angles through the optical mask 360 for a given amount of time to form a 3D polymer microstructure 370. In one configuration, the 3D polymer microstructure 370 includes a porous array structure that includes a series of interconnected polymerized regions that enclose un-polymerized material or open voids areas, such as the box like hatch pattern shown in FIG. 3 below the optical mask 360. To form the open void areas, such as the space formed between the lines forming the box pattern in FIG. 3 (e.g., polymerized regions), the 3D polymer microstructure 370 may be exposed to a jet of gas, vacuum, or washing/rinsing fluids that flushes or removes the uncured material out of the spaces after the pad forming material 310 is processed in the second processing chamber 330 of the processing system 300. Removal can also be performed after processing in the third processing chamber 340.

In one implementation of the processing sequence, after curing the 3D polymer microstructure 370, the 3D polymer microstructure 370 is transferred back to the first processing chamber 320 wherein additional layer of uncured pad forming material is deposited on the 3D polymer microstructure followed by curing in the second processing chamber. These processes may be repeated until a chosen thickness and/or pad mechanical property is achieved.

In some implementations, after curing, the 3D polymer microstructure 370 is transferred to the third processing chamber 340 for forming additional features 372 (e.g., top pad features) on the 3D polymer microstructure 370. In one implementation, the third processing chamber 340 is configured to perform a printing process, such as a massively parallel inkjet printing process or a drop-on-demand digital dispensing system, to perform the additional features 372. The additional features 372 may also be formed by an additive manufacturing process. An additive manufacturing process may include, but is not limited to a process, such as a polyjet deposition process, an inkjet printing process, a fused deposition modeling process, a binder jetting process, a powder bed fusion process, a selective laser sintering process, a stereolithographic process, a vat photopolymerization process, a digital light processing, a sheet lamination process, a directed energy deposition process, or other similar 3D deposition process.

In one implementation, the third processing chamber 340 is a three-dimensional printing chamber. The third processing chamber 340 has a third processing region 346. The third processing chamber 340 includes an additive manufacturing device 380 that is used to deposit one or more resin precursor compositions on layers disposed over the 3D polymer microstructure 370. In some implementations, the additive manufacturing device 380 includes at least one of the following a 3D printer head, a gantry for transporting the resin material, and a jetting apparatus. Typically, the additional features 372 are formed layer-by-layer using one or more droplet ejecting printers. The additive manufacturing device 380 and the 3D polymer microstructure 370 may move relative to each other during the deposition process. In one implementation, the droplets are exposed to a UV curing process to form the additional features 372. The additional features may be cured using electromagnetic radiation from electromagnetic radiation sources 382a, 382b.

Solid structures, truss structures, or both can be printed accordingly. For truss structures, support materials may be dispensed to create sacrificial supports during the printing process. The sacrificial supports are removed during the cleaning process. Printing can be roll-to-roll using a partially cured sub-pad this is bendable then cured to full strength.

In some implementations, a polishing pad formed according to the implementations described herein includes pores that are formed within the unitary pad body in a desirable distribution or pattern so that the properties of a formed layer within, for example, the first or the second polishing elements or overall pad structure will have desirable thermal and/or mechanical properties. Thus, by tailoring the composition of the various material(s) and formed porosity within portions of the pad body, via an additive manufacturing process, the properties of one or more regions of the polishing pad can be controlled. It is believed that the formation of porosity in at least the surface of the formed pad will help to increase pad surface interaction with slurry and slurry nanoparticle (e.g., ceria oxide and silicon dioxide) loading on the pad, which can enhance the polishing removal rate and reduce the common wafer-to-wafer removal rate deviations typically found in CMP processes.

In one implementation, a rectangular pattern of pore-forming regions are formed by dispensing one or more droplets of a porosity-forming agent from a first printer head onto a surface and then at least partially surrounding a pore-forming region with one or more structural material containing regions that include a material that is formed by dispensing droplets of one or more resin precursor compositions from at least a second printer head. The porosity-forming agent can then later be removed in a post-processing operation or during a polishing process to form pores in one or more layers of the polishing pad. In one implementation, the porosity-forming agent material is removed from a formed polishing pad when the polishing pad is used in a CMP polishing process. In this implementation, the porosity-forming agent material may be removed due to the interaction of the porosity-forming agent disposed at a surface of the first or second polishing elements in the advanced polishing pad with one or more components found within a slurry that is disposed between the first and/or second polishing elements and a substrate that is being polished. In some implementations, the pore-forming regions are surrounded by a structural material-containing region that is formed by dispensing droplets of a resin-precursor formulation across a surface on which the layer is formed. By use of the various techniques described herein, compositional gradients in the cured structural material found within the structural material-containing region and/or gradients in the size and density of the pore-forming regions can be used to form at least part of a complete polishing pad that has desirable mechanical and thermal properties. The composition of the pore-forming material disposed within the pore-forming regions and distribution and size of the pore-forming regions across of the polishing pad (i.e., X-Y plane) or through the thickness of the polishing element (i.e., Z direction) may vary in any suitable pattern. Although polishing pads described herein are shown to be formed from two kinds of materials, this configuration is not intended to be limiting of the scope of the disclosure provided herein, since polishing pads including three or more kinds of materials is within the scope of the present disclosure. It should be noted that the compositions of the structural material found within a polishing pad, such as the polishing pad design illustrated in FIG. 2, may be varied in a similar manner. Thus, in some implementations, the material found within a formed structural material containing region may include a mixture of two or more different materials that varies in one or more directions across (e.g., X and/or Y direction) or through (e.g., Z direction) the formed layer.

In one implementation, a method of forming a layer of a porous advanced polishing pad according to implementations described herein may include the following steps. First, one or more droplets of a resin composition, such as described herein, are dispensed in a desired X and Y pattern to form the structural material portion of a formed layer. In one implementation, the one or more droplets of a resin composition are dispensed on a support if the one or more droplets constitute a first layer. In some implementations, the one or more droplets of a resin composition are dispensed on a previously deposited layer (e.g., second layer, etc.). Second, one or more droplets of a porosity forming composition containing a porosity-forming agent are dispensed in a desired X and Y pattern to form the pore-forming regions within the formed layer. In one implementation, the one or more droplets of the porosity forming composition are dispensed on a support if the one or more droplets constitute a first layer. In some implementations, the one or more droplets of the porosity forming composition are dispensed on a previously deposited layer. The dispensing processes of the first and second operations are typically performed separately in time and at different X-Y coordinates. Next, or third, the dispensed one or more droplets of the curable resin precursor and the dispensed one or more droplets of the porosity forming composition are at least partially cured. Next, at the optional fourth step, the dispensed one or more droplets of the curable resin precursor and the dispensed one or more droplets of the porosity forming composition are exposed to at least one of an annealing process, a rinsing process, or both to remove the porosity-forming agent. The rinsing process may include rinsing with water, another solvent such as alcohol (e.g., isopropanol) or both. The annealing process may include heating the deposited pad structure to a low temperature (e.g., about 100 degrees Celsius) under a low pressure to vaporize the porosity-forming agent. Next, at the fifth step, an optional second curing process is performed on the formed layer or final pad to form the final porous pad structure. In some cases, the first, second, third and fifth processing steps may also be sequentially repeated in any desired order to form a number of stacked layers before the fourth step is completed.

The formed pad may be subject to additional processes including at least one of dicing and retrieval of the processed substrate, cleaning, annealing and packaging of the finished pads, removing uncured material from the formed pad, and additional curing processes.

Figure 4:
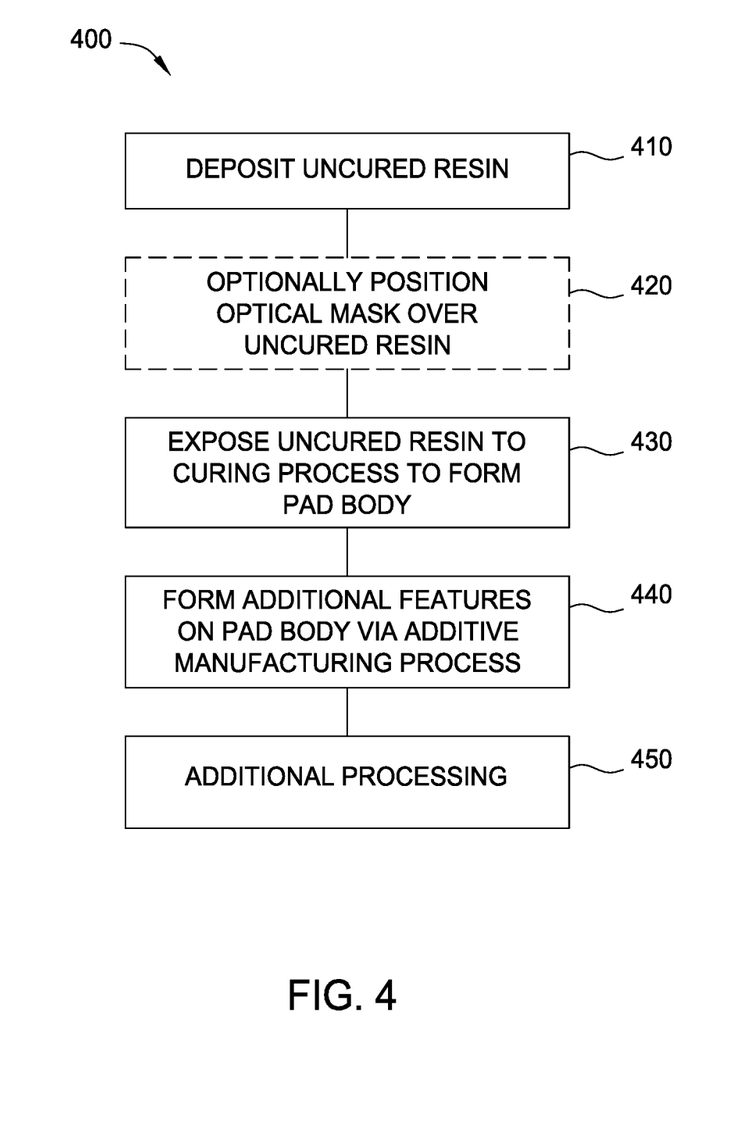
FIG. 4 illustrates a process flow chart summarizing one implementation of a method for forming a polishing pad according to implementations described herein.

FIG. 4 illustrates a process flow chart 400 summarizing one implementation of a method for forming a polishing pad according to implementations described herein. In one implementation, the method is performed using the processing system 300 depicted in FIG. 3. At operation 410, uncured resin is deposited on a substrate. In one implementation, an uncured first layer of a pad forming photopolymer is deposited on a substrate. In one implementation, the uncured first layer of pad forming photopolymer is deposited on the substrate by a single-pass or multi-pass doctor blade coating process, a slot-die coating process, a gravure printing system, or a spraying process.

Optionally, at operation 420, an optical mask is positioned over the uncured resin. In one implementation, the optical mask is secured to the uncured first layer of pad forming photopolymer. In another implementation, the optical mask is separated from the uncured first layer of the pad forming photopolymer by a UV transparent substrate.

At operation 430, the uncured resin is exposed to a curing process to form the pad body. In one implementation, the curing process forms a porous array structure and/or self-propagating photopolymer waveguides in the pad body. In one implementation, the uncured first layer of the pad forming photopolymer is exposed to electromagnetic radiation to selectively polymerize exposed portions of the uncured first layer of the pad forming photopolymer to form pad-supporting structures within the first layer of pad forming photopolymer. In another implementation, the uncured first layer of pad forming photopolymer is exposed to multiple collimated beams at different incident angles through the first optical mask to at least partially cure a portion of the first layer of pad forming photopolymer to form at least a portion of a sub-pad of the polishing pad. In some implementations, the sub-pad and the first optical mask are moved relative to the multiple collimated beams and the sub-pad is exposed to the multiple collimated beams at different incident angles through the first optical mask to cure the sub-pad. The electromagnetic radiation may be emitted from a source selected from a visible light source, an ultraviolet light source, an x-ray source, a light-emitting diode source, or a broadband light source. In one implementation, the first layer of pad forming photopolymer containing the pad supporting structures is exposed to a jet of gas, vacuum, or rinsing fluid to remove uncured portions of the first layer of pad forming photopolymer from the pad supporting structure to form a first layer of 3D polymer microstructure.

Operations 410, 420 and 430 may be repeated until the pad body achieves a chosen thickness and/or chosen polishing property (e.g., static or dynamic mechanical pad property). In one implementation, an uncured second layer of the pad forming photopolymer is deposited on the first layer of 3D polymer microstructure. In one implementation, a second optical mask is positioned over the uncured second layer of the pad forming photopolymer, wherein the second optical mask includes a patterned sheet of material having at least one aperture. In some implementations, the second optical mask is the same as the first optical mask. In some implementations, the second optical mask is different from the first optical mask. In one implementation, the uncured second layer of pad forming photopolymer is exposed to electromagnetic radiation to selectively polymerize exposed portions of the uncured second layer of the pad forming photopolymer to form pad-supporting structures within the second layer of pad forming photopolymer. In one implementation, the second layer of pad forming photopolymer containing the pad supporting structures is exposed to a jet of gas, vacuum, or rinsing fluid to remove uncured portions of the second layer of pad forming photopolymer from the pad supporting structure to form a second layer of 3D polymer microstructure.

In one implementation, the uncured second layer of pad forming photopolymer is exposed to the multiple collimated beams at different incident angles through the second optical mask to partially cure the second layer of pad forming photopolymer. The partially cured second layer of pad forming photopolymer may be exposed to a jet of gas, vacuum, or rinsing fluid to remove the uncured pad forming photopolymer from the partially cured second layer of pad forming material to form a top pad with features on the sub-pad.

At operation 440, additional features are formed on the pad body via an additive manufacturing process. In one implementation, one or more resin precursor compositions are deposited on the first layer or second layer of 3D polymer microstructure via an inkjet printing process. The one or more resin compositions are exposed to a UV curing process to form features on the pad body. At operation 450, the formed pad is subject to additional processing. The additional processing may include at least one of dicing and retrieval of the processed substrate, cleaning, annealing and packaging of the finished pads, removing uncured material from the formed pad, and additional curing processes.

Figure 5:
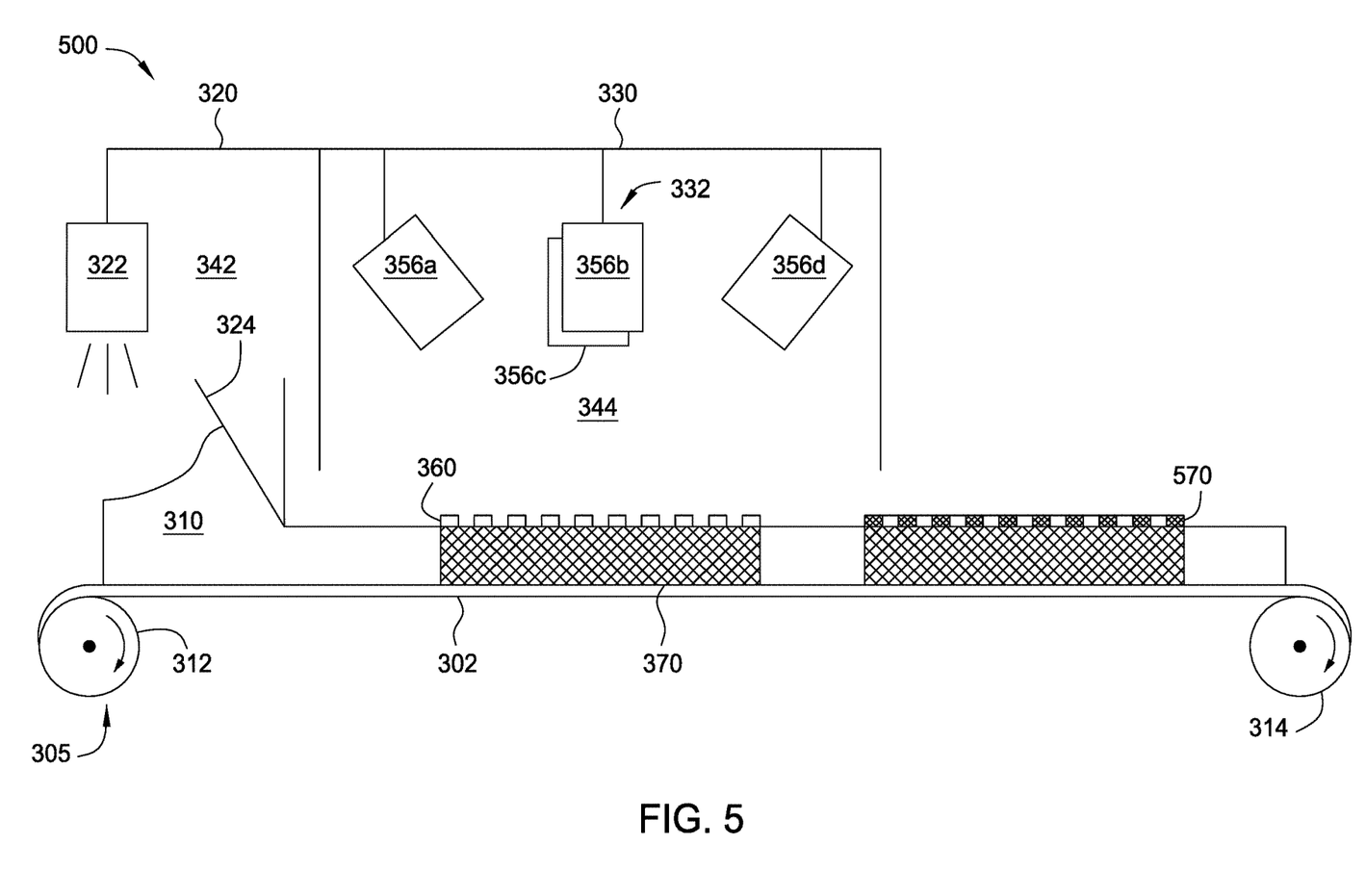
FIG. 5 illustrates a schematic view of another system for manufacturing polishing pads according to implementations described herein.

FIG. 5 illustrates a schematic view of another processing system 500 for manufacturing polishing pads according to implementations described herein. The processing system 500 is similar to the processing system 300 except that rather than using an additive manufacturing process to form additional top pad features 570 on the pad boy, the operations in the first processing chamber 320 and the second processing chamber 330 are repeated to form the additional top pad features 570 on the pad body. Additional chambers similar to the first processing chamber 320 and the second processing chamber 330 can be lined up after the second processing chamber 330 to obtain the top pad features 570. In one implementation, the top pad features 570 may be formed by depositing a resin coating of a thickness (e.g., about 0.1 millimeters to about 1 millimeter) resembling that of the top pad features 570 in the first processing chamber 320 followed by curing the resin coating in the second processing chamber 330 to produce the top pad features that have an internal truss structure, which may be different than the a structure formed in the underlying layer of pad forming material 310.

Figure 6:
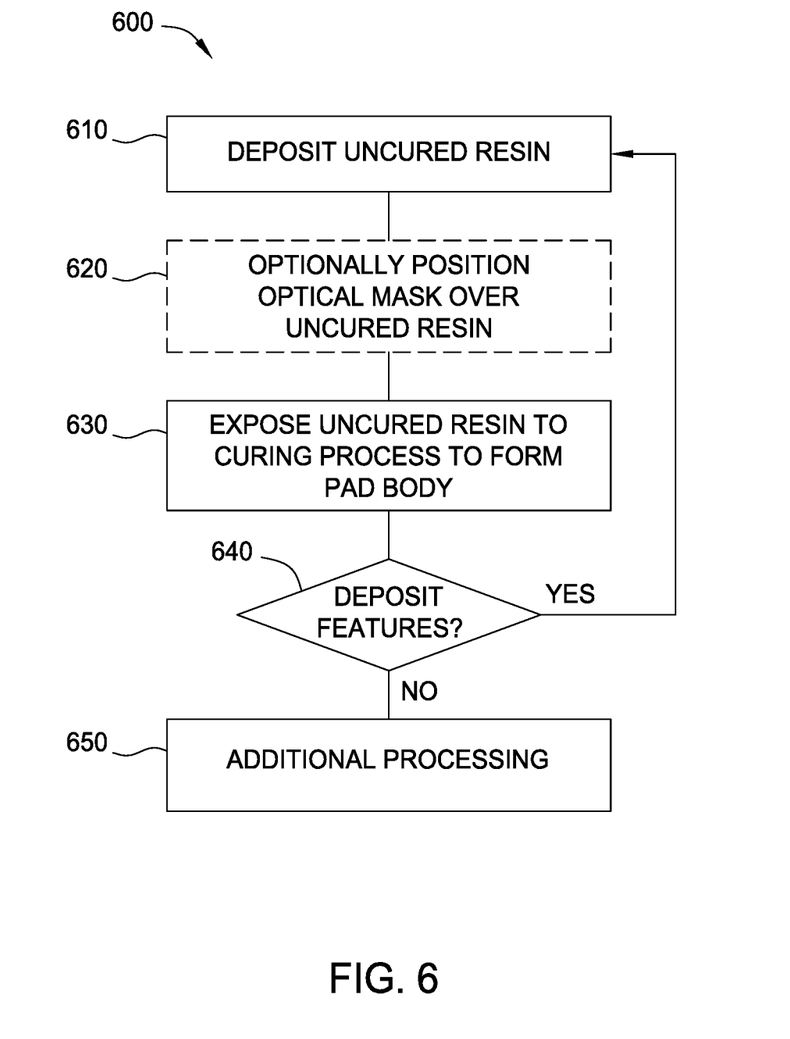
FIG. 6 illustrates a process flow chart summarizing one implementation of a method for forming a polishing pad according to implementations described herein.

FIG. 6 illustrates a process flow chart 600 summarizing one implementation of a method for forming a polishing pad according to implementations described herein. In one implementation, the method is performed using the processing system 500 depicted in FIG. 5. At operation 610, uncured resin is deposited on a substrate. In one implementation, an uncured first layer of a pad forming photopolymer is deposited on a substrate. In one implementation, the uncured first layer of pad forming photopolymer is deposited on the substrate by a single-pass or multi-pass doctor blade coating process, a slot-die coating process, a gravure printing system, or a spraying process.

Optionally, at operation 620, an optical mask is positioned over the uncured resin. In one implementation, the optical mask is secured to the uncured first layer of pad forming photopolymer. In another implementation, the optical mask is separated from the uncured first layer of the pad forming photopolymer by a UV transparent substrate.

At operation 630, the uncured resin is exposed to a curing process to form the pad body. In one implementation, the curing process forms a porous array structure and/or self-propagating photopolymer waveguides in the pad body. In one implementation, the uncured first layer of the pad forming photopolymer is exposed to electromagnetic radiation to selectively polymerize exposed portions of the uncured first layer of the pad forming photopolymer to form pad-supporting structures within the first layer of pad forming photopolymer. In another implementation, the uncured first layer of pad forming photopolymer is exposed to multiple collimated beams at different incident angles through the first optical mask to at least partially cure a portion of the first layer of pad forming photopolymer to form at least a portion of a sub-pad of the polishing pad. In some implementations, the sub-pad and the first optical mask are moved relative to the multiple collimated beams and the sub-pad is exposed to the multiple collimated beams at different incident angles through the first optical mask to cure the sub-pad. The electromagnetic radiation may be emitted from a source selected from a visible light source, an ultraviolet light source, an x-ray source, a light-emitting diode source, or a broadband light source. In one implementation, the first layer of pad forming photopolymer containing the pad supporting structures is exposed to a jet of gas, vacuum, or rinsing fluid to remove uncured portions of the first layer of pad forming photopolymer from the pad supporting structure to form a first layer of 3D polymer microstructure.

At operation 640, if additional features are wanted, operations 610, 620 and 630 may be repeated to form the features on the previously formed pad body until the pad body achieves a chosen thickness. In one implementation, at operation 640, additional features are formed on the pad body via an additive manufacturing process. In one implementation, the top pad features 570 may be formed by depositing a resin coating of a thickness (e.g., about 0.1 millimeters to about 1 millimeter) resembling that of the top pad features 570 in the first processing chamber 320 followed by curing the resin coating in the second processing chamber 330 to produce the top pad features 570 with an internal truss structure. At operation 650, the formed pad is subject to additional processing. The additional processing may include at least one of dicing and retrieval of the processed substrate, cleaning, annealing and packaging of the finished pads, removing uncured material from the formed pad, and additional curing processes.

In summary, some of the benefits of the present disclosure include polishing pads, methods of manufacturing polishing pads, and systems for manufacturing polishing pads that provide uniform removal rates, have extended pad life, and minimize scratching of the polished substrate. Some of the implementations described herein provide cost-effective methods of manufacturing polishing pads with improved control over the features formed on the polishing pad surface. This improved control over feature formation on the pad surface leads to a decrease in non-uniformity of polished substrates.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method of forming a polishing pad, comprising:
depositing an uncured first layer of a pad forming photopolymer on a substrate;
positioning a first optical mask over the uncured first layer of the pad forming photopolymer, wherein the first optical mask includes at least one aperture;
exposing the uncured first layer of the pad forming photopolymer to electromagnetic radiation from multiple collimated beams at different incident angles through the first optical mask to at least partially cure a portion of the uncured first layer of the pad forming photopolymer to form at least a portion of a sub-pad of the polishing pad; and
depositing a plurality of features layer-by-layer on the sub-pad to reach a target thickness, where depositing the plurality of features, comprises:
dispensing one or more resin precursor compositions and one or more porosity-forming agents on the sub-pad via a printing process;
exposing the one or more resin precursor compositions and the one or more porosity-forming agents to a UV curing process to form a layer of the plurality of features; and
repeating the dispensing and exposing to form additional layers of the plurality of features to reach the target thickness.

2. The method of claim 1, further comprising:
moving the sub-pad and the first optical mask relative to the multiple collimated beams; and
exposing the sub-pad to electromagnetic radiation from the multiple collimated beams at different incident angles through the first optical mask to further cure the sub-pad.

3. The method of claim 1, wherein the first optical mask is secured to the uncured first layer of the pad forming photopolymer.

4. The method of claim 1, wherein the first optical mask is separated from the uncured first layer of the pad forming photopolymer by a UV transparent substrate.

5. The method of claim 1, further comprising exposing the sub-pad to a jet of gas, a vacuum, or a rinsing fluid to remove uncured pad forming photopolymer from the sub-pad.

6. The method of claim 1, wherein the uncured first layer of the pad forming photopolymer is deposited on the substrate by a single-pass or multi-pass doctor blade coating process, a slot-die coating process, a gravure printing system, or a spraying process.

7. The method of claim 1, wherein the electromagnetic radiation is emitted from a source selected from a visible light source, an ultraviolet light source, an x-ray source, a light-emitting diode source, or a broadband light source.

8. The method of claim 1, wherein the first optical mask is ceramic, polymeric, or a metal plate.

9. The method of claim 1, wherein the pad forming photopolymer is selected from polyurethane acrylates, polyester acrylates, and epoxy acrylates.

10. The method of claim 1, wherein the plurality of features define channels or grooves.

11. A method of forming a polishing pad, comprising:
depositing an uncured first layer of a pad forming photopolymer on a substrate;
positioning a first optical mask over the uncured first layer of the pad forming photopolymer, wherein the first optical mask includes at least one aperture;
exposing the uncured first layer of the pad forming photopolymer to electromagnetic radiation from multiple collimated beams at different incident angles through the first optical mask to at least partially cure a portion of the uncured first layer of the pad forming photopolymer to form at least a portion of a sub-pad of the polishing pad; and
depositing a plurality of features layer-by-layer on a previously deposited layer via a printing process to reach a target thickness, where depositing the plurality of features, comprises:

dispensing one or more droplets of a porosity-forming agent from a first printer head onto the previously deposited layer, wherein at least one component of the porosity-forming agent is removable to form pores in the polishing pad;

dispensing one or more droplets of a curable resin precursor composition from a second printer head onto the previously deposited layer, wherein the one or more droplets of the curable resin precursor composition form a structural material containing region that surrounds a pore-forming region containing the porosity-forming agent;

exposing the one or more resin precursor compositions and the one or more porosity-forming agents to a UV curing process to form a layer of the plurality of features; and repeating dispensing one or more droplets of the porosity-forming agent, dispensing one or more droplets of the curable resin precursor composition, and exposing to form additional layers of the plurality of features to reach the target thickness.

12. The method of claim 11, further comprising removing the porosity-forming agent during a chemical mechanical polishing process to form pores in the plurality of features.

13. The method of claim 11, further comprising exposing the formed pad structure to at least one of an annealing process and a rinsing process to remove the porosity-forming agent.

14. The method of claim 11, wherein the first optical mask is secured to the uncured first layer of the pad forming photopolymer.

15. The method of claim 11, wherein the first optical mask is separated from the uncured first layer of the pad forming photopolymer by a UV transparent substrate.

16. The method of claim 11, further comprising exposing the sub-pad to a jet of gas, a vacuum, or a rinsing fluid to remove uncured pad forming photopolymer from the sub-pad.

17. The method of claim 11, wherein the uncured first layer of the pad forming photopolymer is deposited on the substrate by a single-pass or multi-pass doctor blade coating process, a slot-die coating process, a gravure printing system, or a spraying process.

18. The method of claim 11, wherein the electromagnetic radiation is emitted from a source selected from a visible light source, an ultraviolet light source, an x-ray source, a light-emitting diode source, or a broadband light source.

19. The method of claim 11, wherein the first optical mask is ceramic, polymeric, or a metal plate.

20. The method of claim 11, wherein the pad forming photopolymer is selected from polyurethane acrylates, polyester acrylates, and epoxy acrylates.

* * * * *